United States Patent
Hamada et al.

(10) Patent No.: US 8,074,351 B2
(45) Date of Patent: Dec. 13, 2011

(54) PART MOUNTING DEVICE AND PART MOUNTING METHOD

(75) Inventors: Ryuji Hamada, Osaka (JP); Akira Kameda, Osaka (JP); Shingo Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/665,830

(22) PCT Filed: Jul. 9, 2009

(86) PCT No.: PCT/JP2009/003211
§ 371 (c)(1),
(2), (4) Date: Dec. 21, 2009

(87) PCT Pub. No.: WO2010/010663
PCT Pub. Date: Jan. 28, 2010

(65) Prior Publication Data
US 2011/0099804 A1    May 5, 2011

(30) Foreign Application Priority Data

Jul. 25, 2008    (JP) .............................. P2008-191589

(51) Int. Cl.
*H05K 3/36*    (2006.01)
(52) U.S. Cl. ................ 29/833; 29/720; 29/739; 29/834; 174/254
(58) Field of Classification Search .................... 29/709, 29/829, 832, 729, 720, 739, 833, 834; 174/254; 345/173
See application file for complete search history.

(56) References Cited

U.S. PATENT DOCUMENTS

2004/0222974 A1    11/2004    Hong et al.
2008/0158181 A1*    7/2008    Hamblin et al. .............. 345/173

FOREIGN PATENT DOCUMENTS

| JP | 06-082808 A | 3/1994 |
| JP | 06-152192 A | 5/1994 |
| JP | 2002-132179 A | 5/2002 |
| JP | 2007-201167 A | 8/2007 |
| JP | 2008-040036 A | 2/2008 |
| JP | 2008-053549 A | 3/2008 |

OTHER PUBLICATIONS

International Search Report for PCT/JP2009/003211.

* cited by examiner

*Primary Examiner* — Livius R Cazan
(74) *Attorney, Agent, or Firm* — Pearne & Gordon LLP

(57) ABSTRACT

A panel is mounted on the stage while the one end electrode of the FPC (flexible board) is mounted on the mounting part of one surface of the panel and the other surface of the panel is facing upward. A mounting method includes bending the other end side of the flexible board, after holding the other end portion including the other end electrode, which is positionally adjusted based on the position recognition result of the mounting portion the press tool recognizing the position of the other end electrode, matching the positions of the mounting portion and the other end electrode by relative positional adjusting, and mounting the other end electrode on the mounting portion by temporarily pressing the other end electrode on the mounting portion.

6 Claims, 17 Drawing Sheets

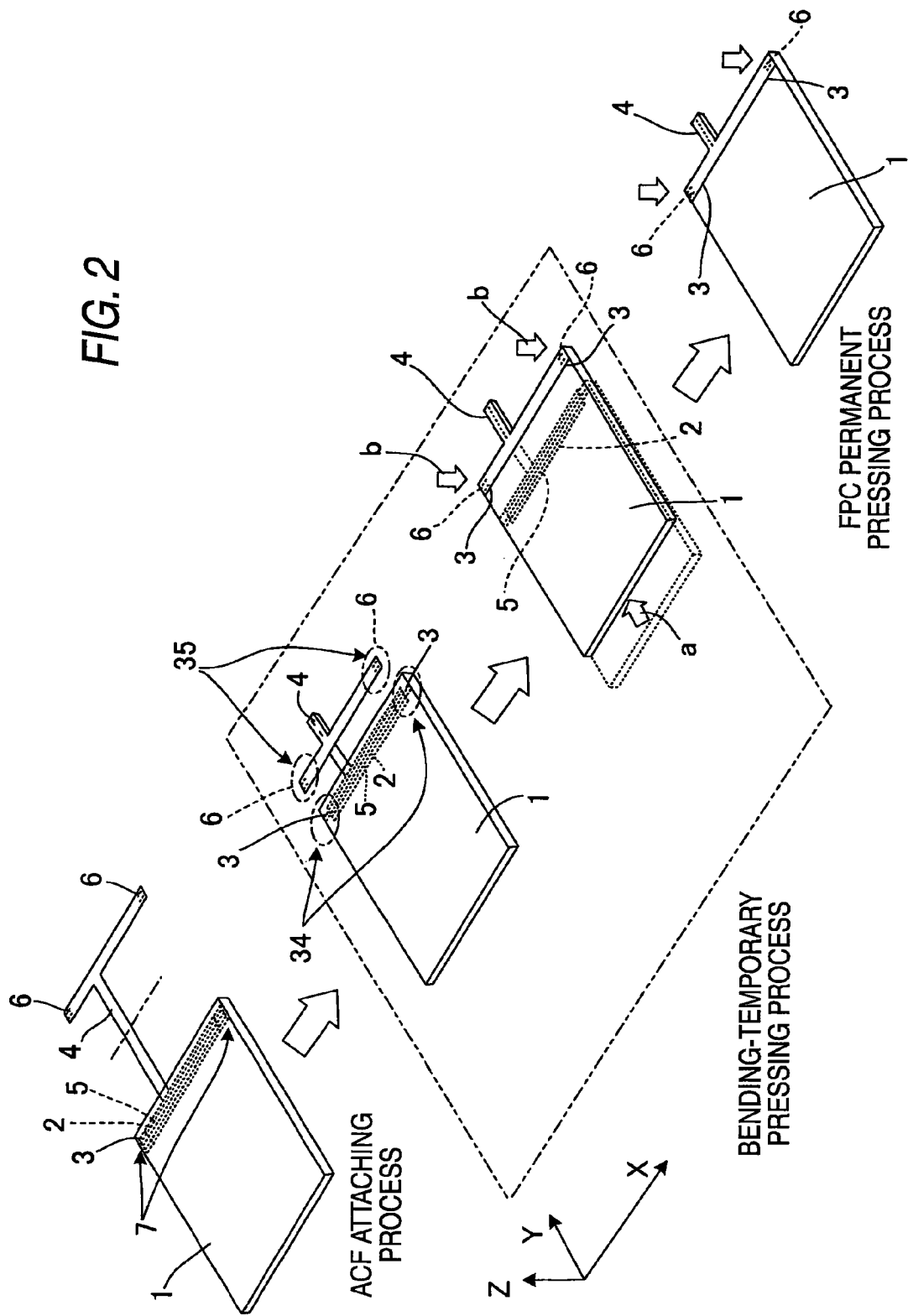

FPC RECOGNITION MARK

PANEL RECOGNITION MARK

FPC RECOGNITION MARK

PANEL RECOGNITION MARK

FIG. 14
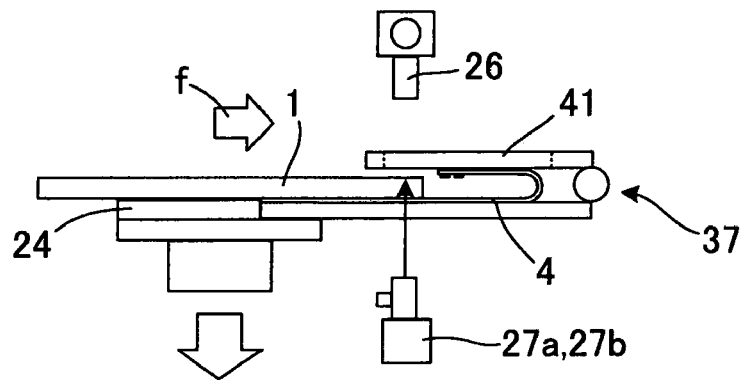
Step21
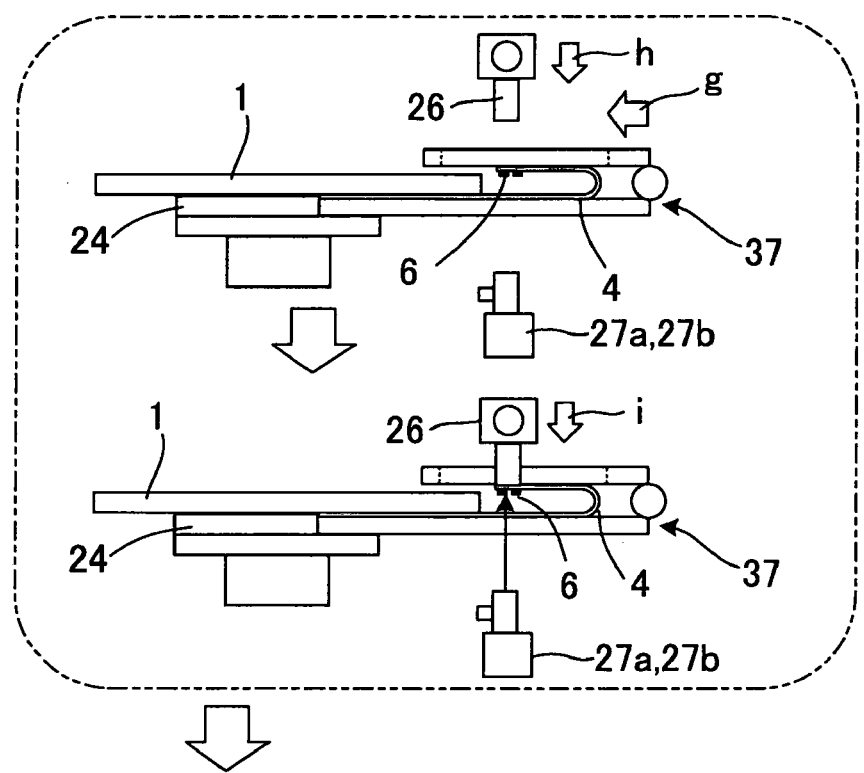
Step22
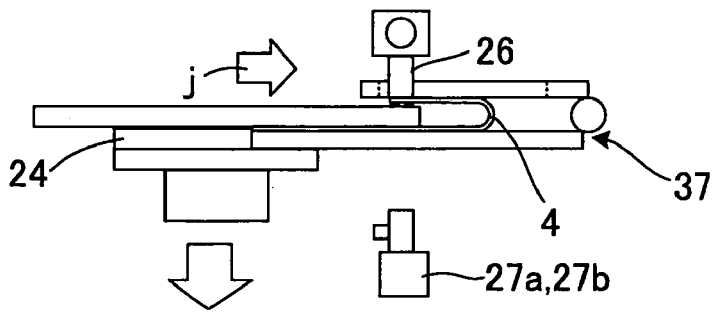
Step23

FIG. 15
Step24
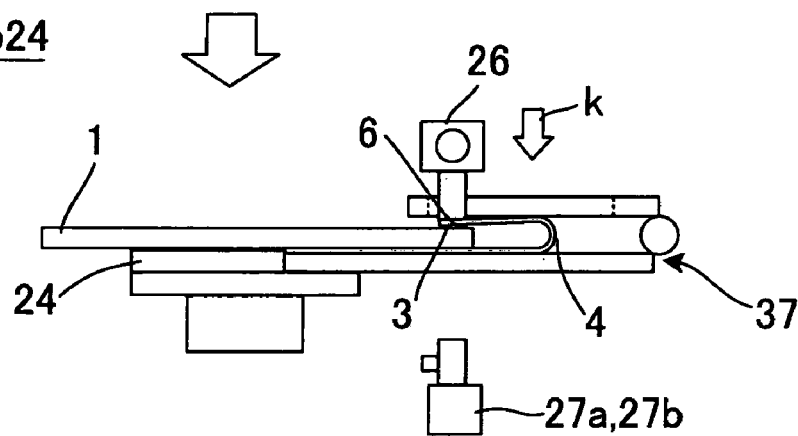
Step25
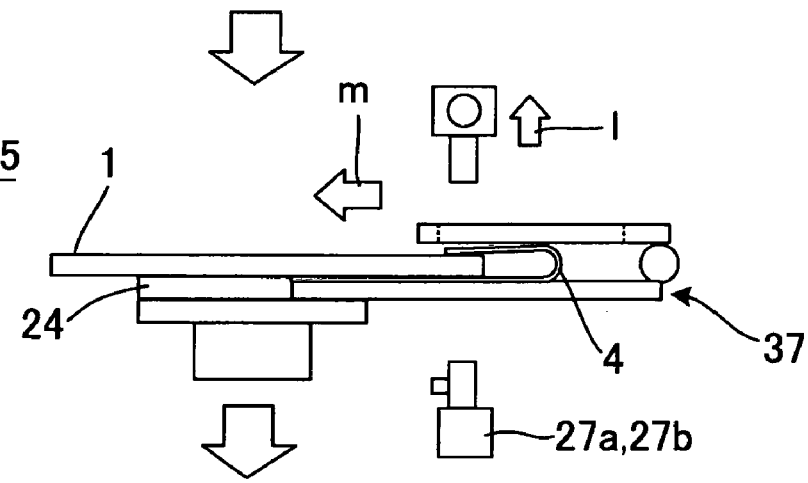

FIG. 16
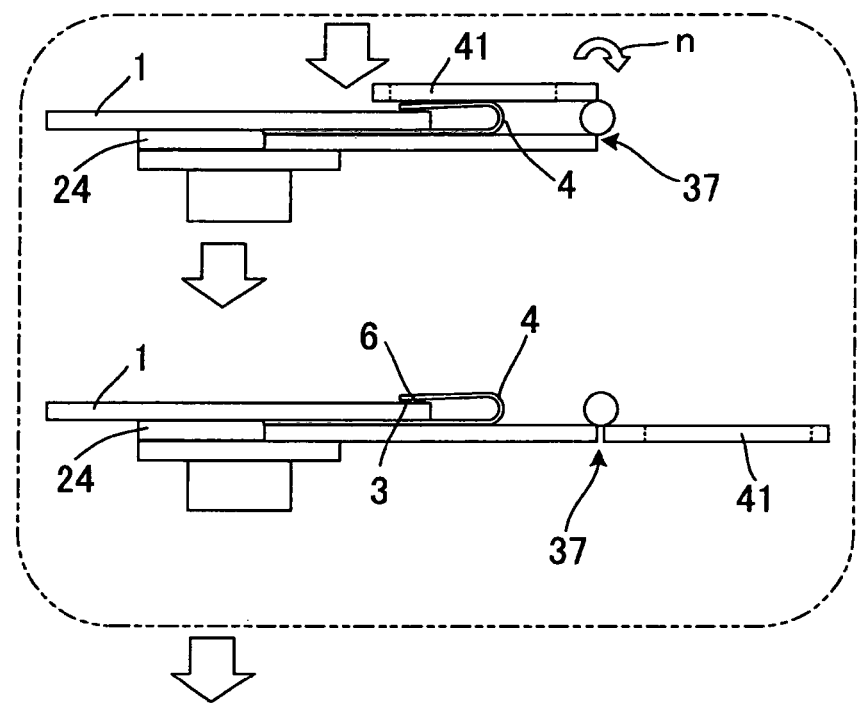
Step 31
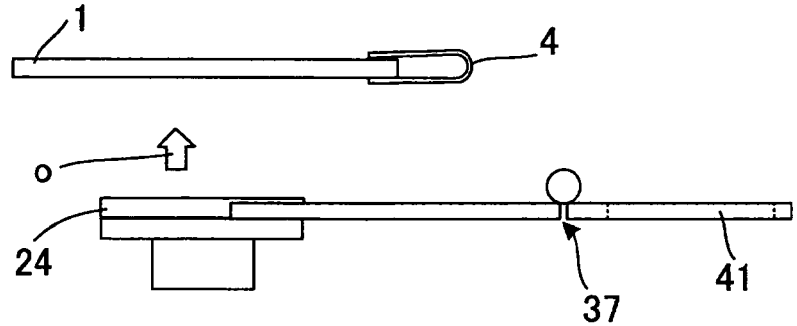
Step 32

PANEL RECOGNITION HEIGHT
(PANEL MOUNTING HEIGHT + d1)

FPC RECOGNITION HEIGHT
(FPC MOUNTING HEIGHT + d1)

FPC HEIGHT AT THE TIME
OF MOVEMENT OF PANEL
(FPC MOUNTING HEIGHT + d2)

FPC MOUNTING HEIGHT
PANEL MOUNTING HEIGHT

PART MOUNTING DEVICE AND PART MOUNTING METHOD

This application is a National Stage application of PCT/JP2009/003211, filed Jul. 9, 2009.

TECHNICAL FIELD

The present invention relates to a part mounting device and a part mounting method, and particularly relates to a part mounting device and a part mounting method by which a flexible board such as FPC (Flexible Print Circuit), COF (Chip on Film), and TCP (Tape Carrier Package) is bent and both end electrodes of the flexible board are mounted on mounting portions of both surfaces of a panel respectively.

BACKGROUND

A touch panel which enables signal input by touching a screen of a display device without an input device is widely used. As a configuration of the touch panel, a various kind of touch panel such as a resistive type in which an upper transparent substrate on which an upper transparent electrode is formed and a lower transparent substrate on which an lower transparent electrode is formed are stacked with a predetermined interval, and a touch position is detected depending on a resistivity change due to a current flow between the upper transparent electrode and the lower transparent electrode when the upper transparent electrode is touched, an electromagnetic field type which detects a change in electromagnetic field, a capacitive type which detects a change in a capacitance, or the like are known. (For example, refer to Patent Literature 1)

Incidentally, in a manufacturing process of the capacitive type touch panel in which electrodes are disposed on both surface of a panel and a touch position is recognized depending on a capacitance change between electrodes when the panel surface is touched by hand, there is a mounting process through which both end electrodes of a flexible board such as FPC, COF, and TCP are mounted on connection electrodes provided both surfaces of a one side edge of the panel so as to connected with electrodes disposed on both surface of the panel. Conventionally, in this mounting process, after performing a mounting process mounting a one end electrode 65 of a flexible board 64 on a connection electrode 62 of a one surface of the panel 61 as shown in FIG. 19A, the panel 61 on which the flexible board 64 is mounted is transferred to another process. In the another process, by a manual process, the panel 61 is turned upside down, the other electrode 66 is press-connected to a connection electrode 63 of the other surface of the panel 61, an ACF (Anisotropic Conductive Film) is attached on the connection electrode 63 of the other surface of the panel 61, and the other end of the flexible board 64 is bent at bending position 68 as shown in FIG. 19B.

In order to mount a flexible board on which a drive circuit for driving a liquid crystal display panel is mounted on two edges of the liquid crystal display panel with only one flexible board, a mounting method connecting a second connection lead of the flexible board to a second edge of the liquid crystal display panel by connecting a first connection lead of the flexible board to a first edge of the liquid crystal display panel, mounting the liquid crystal display panel on a stage while turning the liquid crystal display upside down and mounting the flexible board on a plate which is 180° turnable, bending the flexible board 180° by turning the plate 180°, and overlapping the flexible board on the liquid crystal display panel is known. (For example, refer to Patent Literature 2)

Also, in order to mount a flexible board including a laminated substrate which is given by laminating the other substrate on the one substrate, has a connection electrode at a projecting portion of the one substrate projecting from the other substrate, and mounts a semiconductor tip thereon, a mounting method mounting a flexible board in a dead space above the projecting portion of the one substrate by connecting one end electrode of the flexible board to the connection electrode, bending a flexible board U-shape so that the semiconductor tip directs inside, fixing the other end of the flexible board on the other substrate, and providing a connection electrode on an outer surface of the other end of the flexible board in the above condition.

Citation List

Patent Literature
Patent Literature 1: JP-A-2004-213610
Patent Literature 2: JP-A-H06-82808
Patent Literature 3: JP-A-H06-152192

SUMMARY

Technical Problem

However, there is a problem that work efficiency and productivity are low if the manufacturing process of the touch panel includes a conventional another manual process for mounting the both end electrodes of the flexible board on the connection electrodes of the both surface of the panel.

It is conceivable to adopt the technical solution described in the Patent Literature 2 for automatization of the mounting process. The technical solution is configured to connect the first and the second connection lead provided on the flexible board correspondingly to the two edge of the liquid crystal display panel. Also, when the second connection lead of the flexible board is connected to the second edge of the liquid crystal display panel, the technical solution is configured to recognize reference marks provided on the second connection lead and the second edge and perform a position adjustment of the liquid crystal display panel so that the both reference marks are aligned and the center position thereof is coincide. However, since the technical solution is configured to move the stage to a press position and press-connect the liquid crystal panel and the flexible board by a press-tool after the position adjustment, there is a fear of a misalignment until finally connected due to misalignments caused by the movement to the press position and the press by the press tool. Therefore, in a case where the connection leads of the flexible board and connection electrodes of the panel requires high precision, it is impossible to perform a highly reliable mounting.

Also, in Patent Literature 3, a configuration that connects the both ends of the flexible board to the substrate by bending the flexible board in U-shape is described. However, although the one end electrode of the flexible board is connected to the connection electrode of the substrate, the other end of the flexible board is just only fixed to the surface of the substrate. Therefore, there is no suggestion in Patent Literature 3 about a technology which realize a highly reliable mounting when the both end electrodes of the flexible board is mounted to the connection electrode of both surface of the panel.

The present invention addresses the above described conventional problem and the object of which is to provide a part mounting device and a part mounting method which precisely mount the both end electrodes of the flexible board to mounting portions of both surfaces of the panel and thereby realize a highly reliable mounting.

Solution to Problem

A part mounting device of the present invention is a part mounting device which bends a flexible board whose one end electrode is mounted on a mounting portion of a one surface of a panel so as to mount the other end electrode of the flexible board on a mounting portion of the other surface of the panel, including a stage which moves and positions the panel while supporting the panel with the other surface facing upward; a bending unit holding and bending the other end side of the flexible board; a recognition camera disposed at the one surface side of the panel supported by the stage and recognizing a position of the mounting portion of the other surface of the panel and a position of the other end electrode of the flexible board; a press head mounting the other end electrode of the flexible board on the mounting portion of the other surface of the panel while holding the other end electrode of the flexible board and temporarily pressing the other end electrode of the flexible board to the mounting portion of the other surface of the panel; a controller which motion controls the stage, the bending unit, the recognition camera, and the press head so as to bend the other end side of the flexible board in a state where a position in plan view of the mounting portion of the other surface of the panel and a position in plan view of the other end electrode of the flexible board are shifted each other, recognize the position of the mounting portion of the other surface of the panel, hold the other end electrode of the flexible board with the press head, recognize the position of the other end electrode of the flexible board, match the position of the mounting portion of the other surface of the panel and the position of the other end electrode of the flexible board, and mount the other end electrode of the flexible board to the mounting portion of the other surface of the panel by temporarily pressing the other end electrode of the flexible board to the mounting portion of the other surface of the panel with the press head.

According to the configuration, the other end electrode of the flexible board can be precisely mounted on the mounting portion of the other surface of the panel by bending the other end side of the flexible board in a state where a position in plan view of the mounting portion of the other surface of the panel and a position in plan view of the other end electrode of the flexible board are shifted each other, recognizing the position of the mounting portion of the other surface of the panel, hold the other end electrode of the flexible board with the press head, recognizing the position of the other end electrode of the flexible board, matching the position of the mounting portion of the other surface of the panel and the position of the other end electrode of the flexible board, and mounting the other end electrode of the flexible board to the mounting portion of the other surface of the panel by temporarily pressing the other end electrode of the flexible board to the mounting portion of the other surface of the panel with the press head. Thereby, it is possible to produce a highly reliable part in which the both end electrodes are precisely mounted on the mounting portions of the both surface of the panel.

Also, in a case where the bending unit includes a suction supporter which suctions and holds at least the other end of the flexible board or the vicinity thereof except for the mounting portion of the other end electrode of the flexible board in a direction perpendicular to the longitudinal direction, it is possible to bend the flexible board while the vicinity of the other end electrode of the flexible board is suctioned and held in the direction perpendicular to the longitudinal direction and hold the vicinity of the other electrode of the flexible board in a plane while the flexible board is bent. Thereby, it is possible to securely hold the vicinity of the other end electrode of flexible board in plane with the pressing head.

Also, in a case where the press head includes a suction holder which suctions and holds the other end of the flexible board including the other end electrode of the flexible board or the vicinity thereof, the other end of the flexible board including the other electrode or the vicinity thereof is suctioned and held while kept in a plane. Therefore, there is no fear that misalignment during the operation until the provisional pressing. Thus, it is possible to mount the other end electrode of the flexible board with high positional precision on the mounting portion of the other surface of the panel by provisional pressing with press head.

Also, in a case where the controller controls the stage and the press head so that the height of the mounting portion of the other surface of the panel and the height of the other electrode are respectively set at a mounting height or at a height higher or lower than the mounting height in a predetermined distance when the controller recognizes the position of the mounting portion of the other surface of the panel and the position of the other end electrode of the flexible board, it is possible to mount with high precision by recognizing the position of the mounting portion of the other surface of the panel and the position of the other end electrode of the flexible board at the mounting height or at the height higher or lower than the mounting height in the predetermined distance. In order to secure the high positional precision, it is preferable to recognize the position at the mounting height. However, in a case where the tact time is long because the movement to the recognition position is complicated for preventing the stage and the press head from interfering with the support member or the like while moving to the recognition position same as the mounting position, since a movement to the mounting position with a relatively small deviation in several millimeter (2 or 3 millimeter) does not affect the positional precision, it may be possible to recognize the position at the height higher or lower than the mounting height in predetermined distance.

A part mounting method according to the present invention is a part mounting method for bending a flexible board whose one end electrode is mounted on a mounting portion of a one surface of a panel so as to mount the other end electrode of the flexible board on a mounting portion of the other surface of the panel, including a panel supporting process supporting the panel on a stage with the other surface upward; a bending process holding and bending the other end side of the flexible board in a state where a position in plan view of the mounting portion of the other surface of the panel and a position in plan view of the other end electrode of the flexible board are shifted each other; a mounting portion recognition process recognizing a position of the mounting part of the other surface of the panel with a recognition camera disposed at the one surface side of the panel; a holding process holding the other end electrode of the flexible board with a press head; a the other end electrode recognizing process recognizing a position of the other end electrode of the flexible board with the recognition camera disposed at the one surface side of the panel; a position matching process matching the position of the mounting portion of the other surface of the panel and the position of the other end electrode of the flexible board; a mounting process mounting the other end electrode of the flexible board to the mounting portion of the other surface of the panel by temporarily pressing the other end electrode of the flexible board to the mounting portion of the other surface of the panel with the press head.

According to the configuration, as described above, it is possible to precisely mount the other end electrode of the flexible board on the mounting portion of the other surface of the panel. Thereby, it is possible to manufacture a highly reliable part in which the both end electrodes of the flexible board are precisely mounted on the mounting portion of the both surface of the panel.

Also, during the mounting portion recognition process and the the other end electrode recognition process, the mounting with high positional precision is possible as described above by recognizing the mounting portion of the other surface of the panel and the other end electrode of the flexible board while the mounting portion of the other surface of the panel and the other end electrode of the flexible board are positioned at a mounting height or a height higher or lower than the mounting height in a predetermined distance.

Advantage of Invention

According to the part mounting device and the part mounting method, the other end electrode of the flexible board can be precisely mounted on the mounting portion of the other surface of the panel by bending the other end side of the flexible board in a state where a position in plan view of the mounting portion of the other surface of the panel and a position in plan view of the other end electrode of the flexible board are shifted each other, recognizing the position of the mounting portion of the other surface of the panel, hold the other end electrode of the flexible board with the press head, recognizing the position of the other end electrode of the flexible board, matching the position of the mounting portion of the other surface of the panel and the position of the other end electrode of the flexible board, and mounting the other end electrode of the flexible board to the mounting portion of the other surface of the panel by temporarily pressing the other end electrode of the flexible board to the mounting portion of the other surface of the panel with the press head. Thereby, it is possible to produce a highly reliable part in which the both end electrodes are precisely mounted on the mounting portions of the both surface of the panel.

BRIEF EXPLANATION OF DRAWINGS

[FIG. 2] A perspective view showing a part mounting method of the exemplary embodiment.

[FIG. 14] Explanations of each step shown in process flow of FIG. 13.

[FIG. 15] Explanations of each step shown in process flow of FIG. 13.

[FIG. 16] Explanations of each step shown in process flow of FIG. 13.

DESCRIPTION OF EMBODIMENT

Now, a process of mounting a flexible board (hereinafter, referred to as an FPC) to a touch panel (hereinafter, referred to as a panel) in a part mounting device according to an embodiment of the invention will be described with reference to FIGS. 1 to 18.

Figure 1:
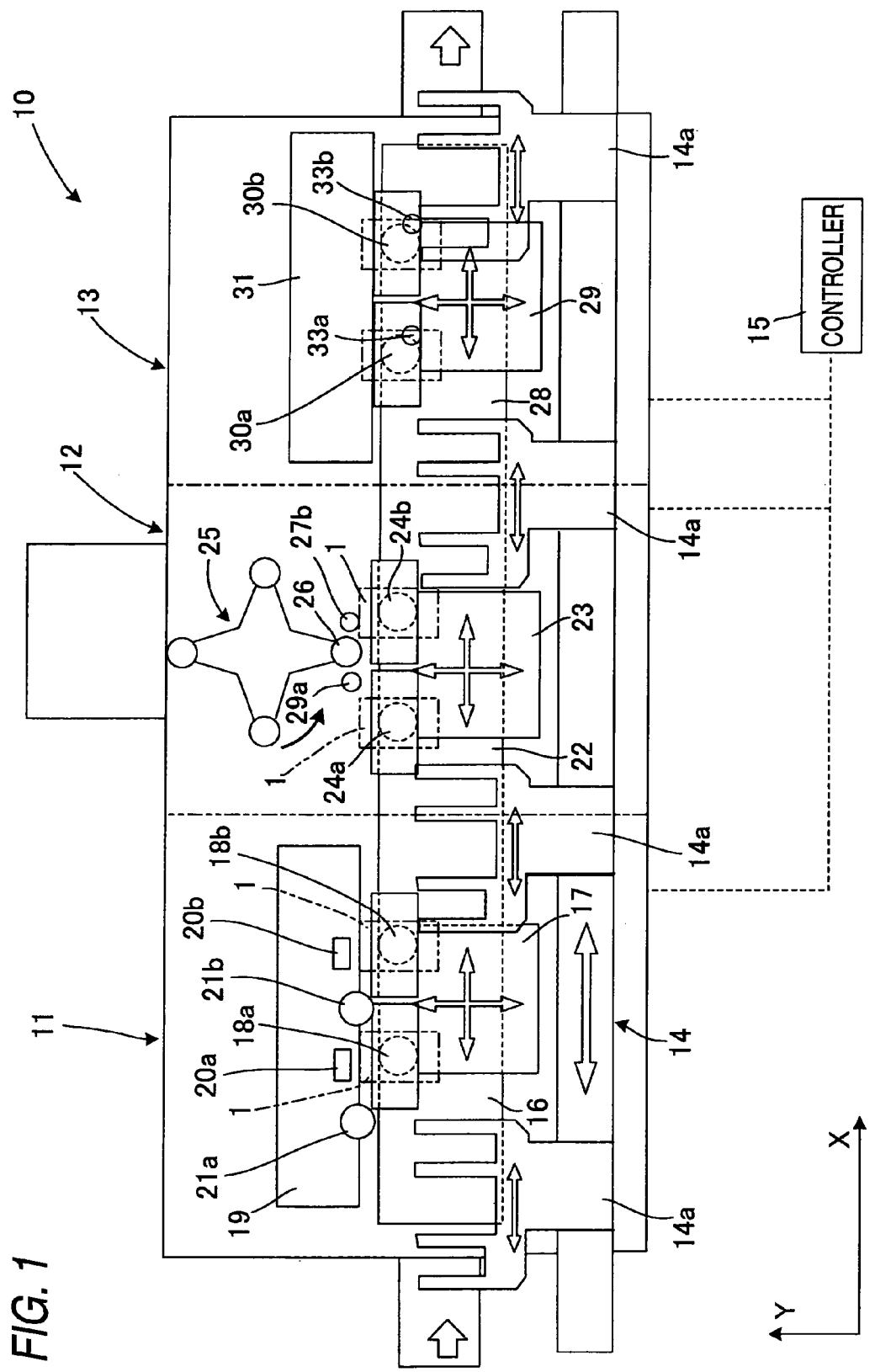
[FIG. 1] A plan overview showing a configuration of an exemplary embodiment of the part mounting device according to the present invention.
Figure 3A:
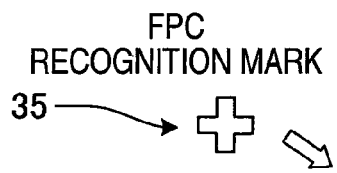
[FIGS. 3A-3C] Explanatory views showing concrete examples of recognition marks and position matching.
Figure 3C:
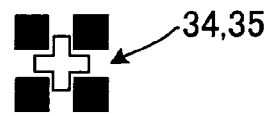
Figure 3B:
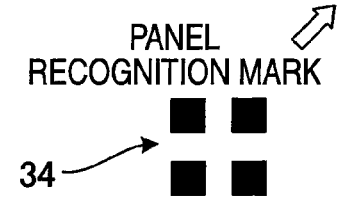
Figure 6:
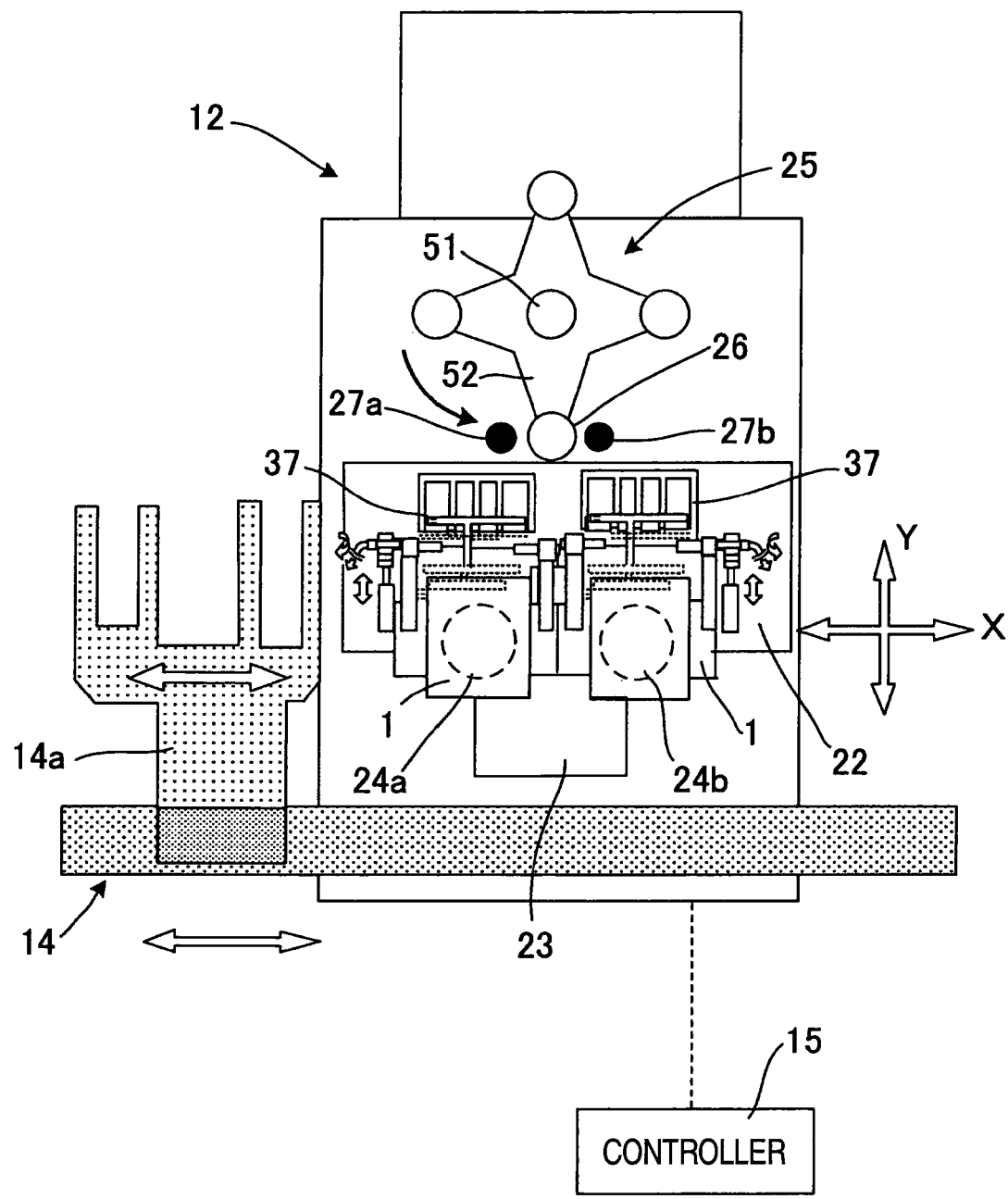
[FIG. 6] A plan view showing a bending-temporarily pressing device of the exemplary embodiment.

In FIGS. 1, 2 and 6, a panel 1 is installed a part mounting device 10 according to the embodiment, in a state in which one end electrode 5 of an FPC 4 has been connected to a mounting portion 2 of one surface of the panel 1 in a precedent process, and the panel has been turned upside down in such a way that the other surface thereof faces in an upward direction. The part mounting device 10 includes an ACF attaching device 11 that attaches an anisotropic conductive adhesive (hereinafter, referred to as ACF) 7 to the mounting portion 3 of the other surface of the installed panel, a bending-temporary pressing device 12 that bends the other end side of the FPC 4, aligns a position of the mounting portion 3 of the other surface and a position of the other end electrode 6 of the FPC 4, and temporarily presses the mounting portion 3 of the other surface and the other end electrode 6 of the FPC 4, with the ACF 7 being interposed therebetween, and a permanent pressing device 13 that permanently presses the mounting portion 3 of the other surface and the other end electrode 6 of the FPC 4. The part mounting device is adapted to transfer the panel 1 to a panel transfer unit 14 by a support arm 14a thereof, supply the panel 1 sequentially to the ACF attaching device 11, the bending-temporary pressing device 12 and the permanent pressing device 13, and carry the panel 1 mounted with the FPC 4 toward the next process. The operation of the ACF attaching device 11, the bending-temporary pressing device 12 and the permanent pressing device 13 are controlled in a lump by the controller 15. The embodiment of FIG. 1 is configured so as to process two panels 1 arranged in parallel.

The ACF attaching device 11 includes a pair of stages 18a and 18b which can be moved and positioned in an X-axial direction and a Y-axial direction by an X-axis table 16 and a Y-axis table 17, an ACF attaching unit 19 having a pair of ACF attaching heads 20a and 20b that attach ACF 7 to the mounting portion 3 of the other surface of the panel 1 supported on the stages 18a and 18b, and recognition cameras 21a and 21b that image-recognize the position of the mounting portion 3 of the other surface. Since the operation of the stages 18a and 18b, the ACF attaching unit 19 and the recognition cameras 21a and 21b is controlled by the controller 15, the ACF attaching device 19 is adapted to perform the ACF attaching process of attaching the ACF 7 onto the mounting portion 3 of the other surface of the panel 1, as shown in FIG. 2.

The bending-temporary pressing device 12 includes, as shown in FIGS. 1 and 6, a pair of stages 24a and 24b that can be moved and positioned in an X-axial direction and a Y-axial direction by an X-axis table 22 and a Y-axis table 23, a temporary pressing unit 25 having a press head 26 which temporarily presses the mounting portion 3 of the other surface of the panel 1 supported on the stages 24a and 24b and the other end electrode 6 of the FPC 4, with the ACF 7 being interposed between the mounting portion 3 of the other surface of the panel 1 and the other end electrode 6 of the FPC 4, and recognition cameras 27a and 27b that image-recognize the position of the mounting portion 3 of the other surface of the panel 1 and the position of the other end electrode 6 of the FPC 4. The pair of stages 24a and 24b have a bending unit 37 for bending the other end side of the FPC 4, as described in detail below. Since the operation of the stages 24a and 24b, the temporary pressing unit 25 and the recognition cameras 27a and 27b is controlled by the controller 15, the bending-temporary pressing device 12 is adapted to perform the bending-temporary pressing process of bending the other end side of the FPC 4, and position-aligning and temporarily pressing the mounting portion 3 of the other surface of the panel 1 and the other end electrode 6 of the FPC 4, as shown in FIG. 2.

The permanent pressing device 13 includes a pair of stages 30a and 30b that can be moved and positioned in an X-axial direction and a Y-axial direction by an X-axis table 28 and a Y-axis table 29, a permanent pressing unit 31 having a press head for permanently pressing the other end electrode 6 of the FPC 4 and the mounting portion 3 of the other surface of the panel 1 temporarily pressed and supported on the stages 30a and 30b, and recognition cameras 33a and 33b that image-recognize the mounting portion 3 of the temporarily pressed panel 1. Since the operation of the stages 30a and 30b, the permanent pressing unit 31 and the recognition cameras 33a and 33b is controlled by the controller 15, the permanent pressing device 13 is adapted to perform the permanent pressing process, as shown in FIG. 2.

Figure 4A:
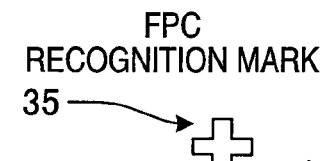
[FIGS. 4A-4C] Explanatory views showing concrete another examples of recognition marks and position matching.
Figure 4C:
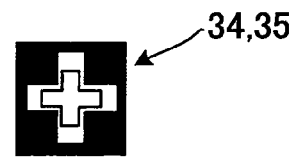
Figure 4B:
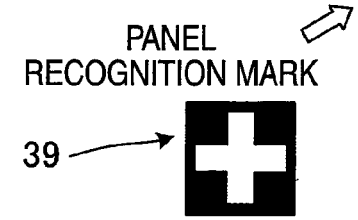
Figure 5:
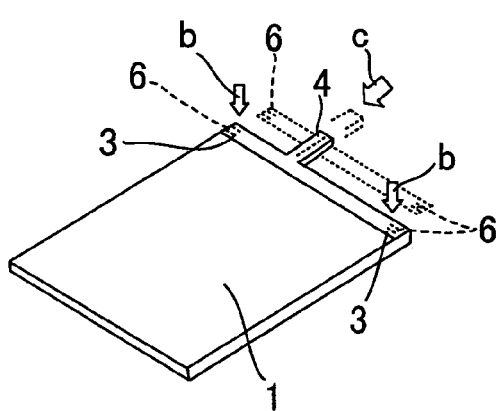
[FIG. 5] A perspective view showing a modified example of the provisional pressing process of the exemplary embodiment.

In the bending-temporary pressing process, as shown in FIG. 2, the other end side of the FPC 4 is bent in a state in which a position of the mounting portion 3 of the other surface of the panel 1 and a position of the other end electrode 6 of the FPC 4 are deviated from each other in a plan view thereof In this case, a panel recognition mark 34 displaying a reference position of the mounting portion 3 of the other surface of the panel 1 is recognized, and then the other end electrode 6 of the FPC 4 of the panel 1, of which the position is corrected by the recognition, and/or its surrounding portion are suctioned and held by the press head 26. An FPC recognition mark 35 displaying a reference position of the other end electrode 6 of the suctioned and held FPC 4 is recognized. As a preferred example of the FPC recognition mark 35 and the panel recognition mark 34, the mark shown in FIGS. 3(a) and 3(b) or the mark shown in FIGS. 4(a) and 4(b) is preferable. After that, in order to match the position of the mounting portion 3 of the other surface of the panel 1 and the position of the other end electrode 6 of the FPC 4, the panel 1 is moved from the position indicated by a dotted line in FIG. 2 in a direction along a surface of the panel 1 as indicated by an arrow a. In this case, by moving the panel in such a way that the FPC recognition mark 35 and the panel recognition mark 34 are in the position alignment state shown in FIG. 3(c) or 4(c), the position of the mounting portion 3 of the other surface of the panel 1 and the position of the other end electrode 6 of the FPC 4 are matched to each other with high accuracy. After that, by moving the press head 26 in a thickness direction of the panel 1 as indicated by an arrow b and then pressing the press head 26, the other end electrode 6 of the FPC 4 and the mounting portion 3 of the other surface of the panel 1 are temporarily pressed, with the ACF 7 being interposed therebetween. In this case, although the panel 1 is moved in a direction indicated by the arrow a in FIG. 2 so as to match the position of the mounting portion 3 of the other surface of the panel 1 and the position of the other end electrode 6 of the FPC 4, as shown in FIG. 5, the other end of the FPC 4 may be relatively moved from the position indicated by a dotted line in a direction along the surface of the panel 1, as indicated by an arrow c, to match the position of the other end electrode 6 of the FPC 4 and the position of the mounting portion 3 of the other surface of the panel 1.

Figure 7A:
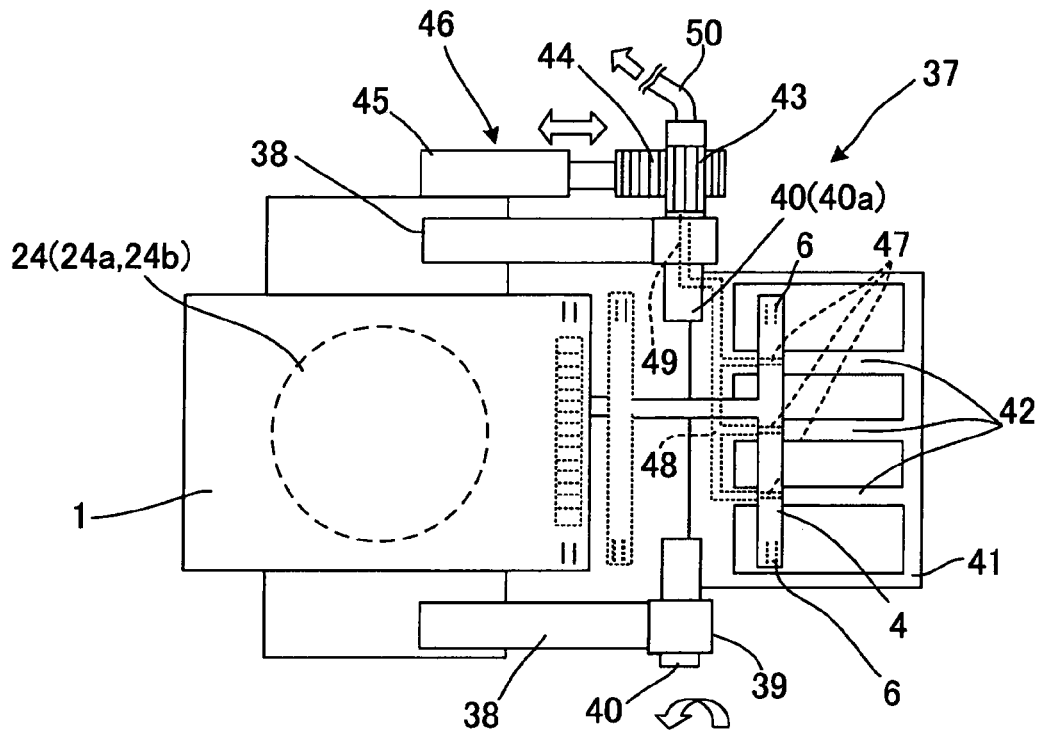
[FIGS. 7A-7B] A plan view and a front view showing a configuration of the bending mechanism of the exemplary embodiment.
Figure 7B:
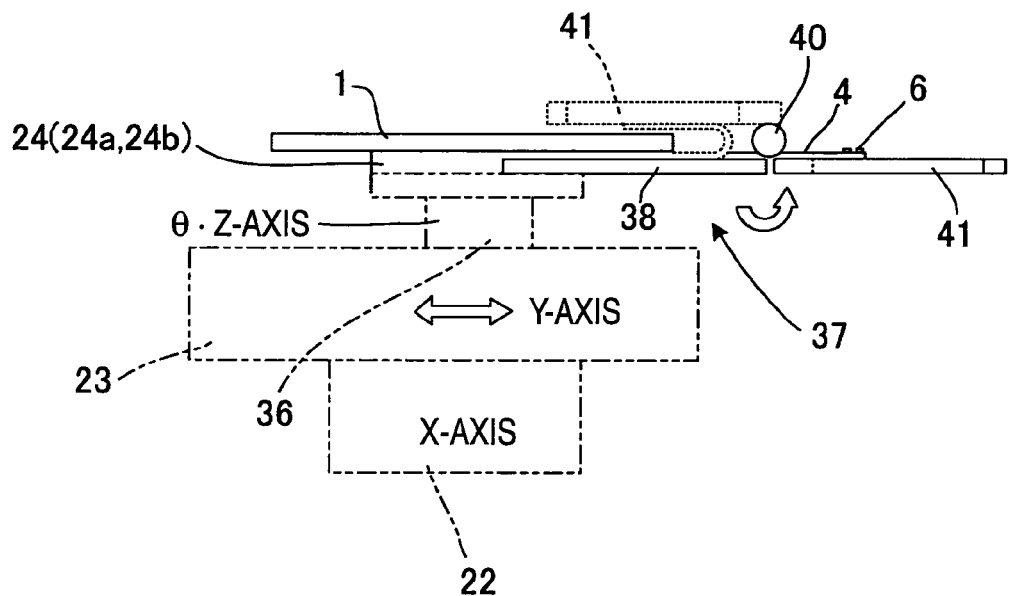

Next, the concrete configuration of the bending-temporary pressing device 12 which is a main part of the invention will now be described with reference to FIGS. 6 to 10. In FIGS. 6, 7(a) and 7(b), the stage 24 (hereinafter, since the stages 24a and 24b have identical configurations, they are referred to as the stage 24) is disposed on a θ•Z-axis table 36 which is disposed on the Y-axis table 23, and is adapted to move and position in four directions of X, Y, Z and θ-axial directions in the state of suctioning and supporting the panel 1. The bending unit 37 for bending the other end side of the FPC 4 is disposed at one side of the temporary pressing unit 25 side of the stage 24.

The bending unit 37 includes a pair of support arms 38 protruding from the stage 24 and spaced apart from each other at an interval larger than a width dimension of the panel 1, and a bending jig 41 of a frame shape fixed to a spindle 40 which is rotatably supported by a pair of bearings 39 installed at a front end upper surface of the pair of support arms 38, the bending jig having a plurality of bars 42 of a ladder shape in a shaft central direction of the bearings 39. The bending unit 37 is adapted to rotate the bending jig 41 by 180 degrees between an open position (indicated by a solid line in FIG. 7(b)) extending in an extension direction of the support arm 38 and a closed position (indicated by a dotted line in FIG. 7(b)) bent on the support arm 38 so as to overlap substantially in parallel with the support arm 38 viewed from the side. One spindle 40a supported by one bearing 39 is extended in a direction opposite to the bending jig 41, and is fixed to a pinion 43, and a rack 44 is meshed with the pinion 43 and freely moved in one direction. The rack 44 is reciprocated by a cylinder device 45, and the bending jig 41 is pivotally driven between the open position and the closed position by the pinion 43, the rack 44 and the cylinder device 45, thereby constituting an opening-closing drive unit 46.

The plurality of bars 42 of the bending jig 41 are provided with suction holes 47 which serve as suction-holding portions, respectively, as shown in FIG. 7(b). Each of the suction holes 47 is connected to a suction pipe 50 via a suction passage 48 formed at the bending jig 41 and a suction passage 49 formed at a shaft central portion of the one spindle 40a. If a suction unit (not shown) connected to the suction pipe 50 is operated, except for the disposition portion of the other end electrode 6 of FPC 4, each of the suction holes 47 has the suction-holding portion that suctions and holds at least the other end of the FPC 4 or its surrounding portion in a direction perpendicular to a longitudinal direction of the other end of the FPC 4, and is adapted to suction the other end of the FPC 4 or its surrounding portion at plural positions.

Figure 8:
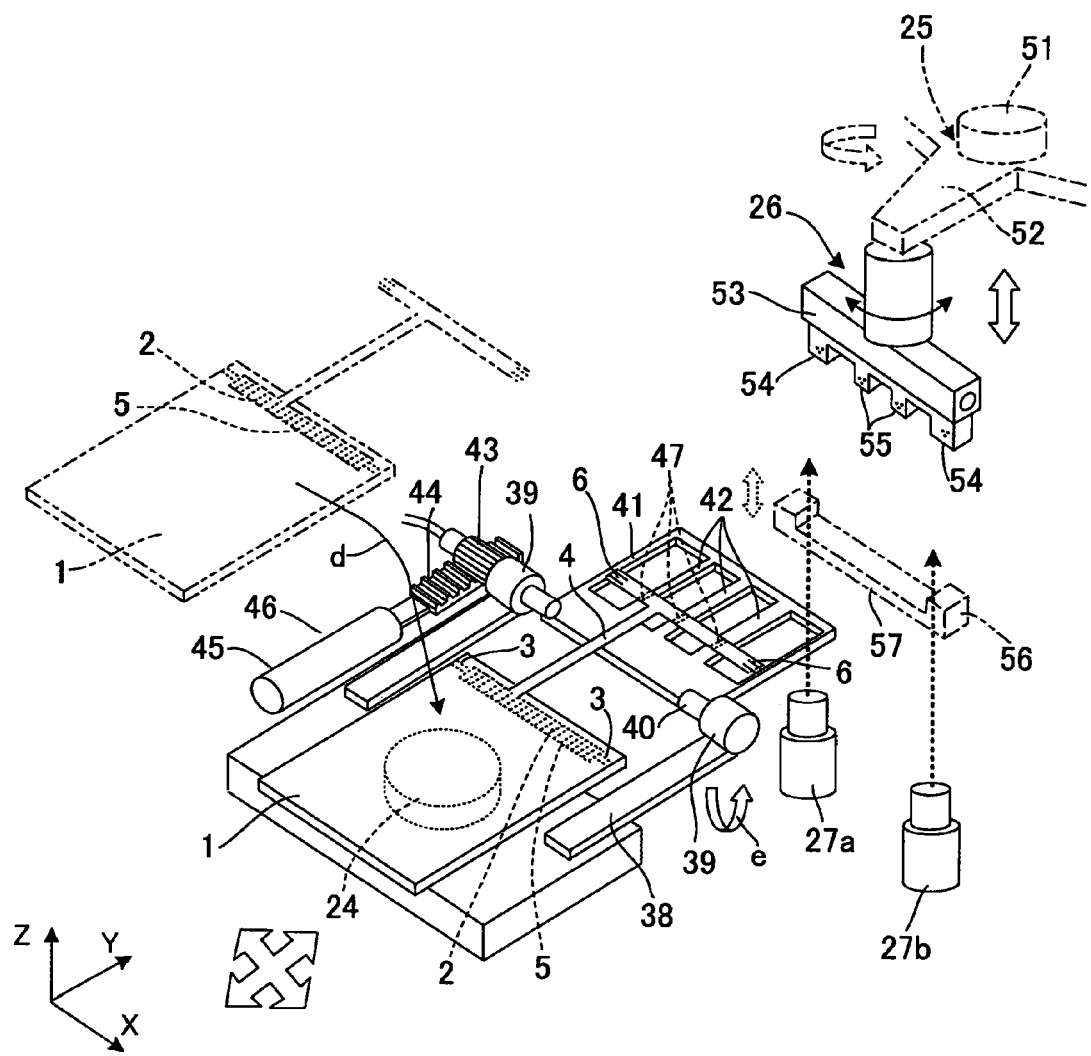
[FIG. 8] A perspective view showing a main configuration and an operation state of the bending-temporarily pressing device of the exemplary embodiment.

The temporary pressing unit 25 includes a plurality of support arms 52 that are installed at a rotor 51, as shown in FIG. 8, and the press head 26 is mounted on each front end of the support arms 52. The press head 26 is adapted to support the press tool 53 in such a way that the rotation position of the press tool around the center of a vertical shaft can be adjusted and the press tool can be driven in a vertical direction. The press tool 53 includes suction-pressing projections 54 abutting against each rear surface of the pair of the other end electrodes 6 of the FPC 4 to suction and hold the FPC and applying heat and pressure to the other end electrodes 6 of the FPC 4 to temporarily press them, and suction projections 55 that suction the rear surface of the other end portion of the FPC 4 at one or plural positions between the suction-pressing projections 54 and 54. In this case, the suction-pressing projections 54 and the suction projections 55 constitute a suction unit, and are disposed to be positioned in a space between the outer frame of the bending jig 41 and the bars 42.

The recognition cameras 27a and 27b are disposed at a position opposite to the suction-pressing projections 54 of the press tool 53 under the panel 1 placed on the stage 24. In addition, a lower base member 56 made of a transparent material is placed on the stage 24, and abuts against the rear surface of the mounting portion 3 of the other surface of the panel 1 at a position immediately under the mounting portion 3 of the panel 1 to be temporarily pressed and a position immediately over the recognition cameras 27a and 27b, if necessary, when temporary pressing is performed, to be applied with pressure at the time of temporary pressing. In the lower base member 56, the portion opposite to the suction-pressing projections 54 protrudes upward, and a relief recess 57 for avoiding interference with the bent portion of the FPC 4 is formed therebetween. The lower base member 56 may be disposed in such a way that it is stationary or is moved in a vertical direction.

An outline of the operation of the bending-temporary pressing device 12 having the above-described configuration will now be described with reference to FIGS. 8 and 9. First, the one end electrode 5 of the FPC 4 is touch panel to the mounting portion 2 of the one surface, and the panel 1 which is turned upside down is placed and supported by suction on the stage 24, as indicated by an arrow d in FIG. 8. In this case, the panel 1 is disposed in such a way that the other end of the FPC 4 is positioned on the suction holes 47 formed in the bar 42 of the bending jig 41, and the other end portion including the other end electrode 6 is positioned and placed to deviate to the position which is spaced apart from the side edge portion of the panel 1 at appropriate interval, at which the mounting portion 3 of the other surface of the panel 1 is disposed, when the bending jig 41 is rotated by 180 degrees to bend the other end side of the FPC 4. Except for the disposition portion of the other end electrode 6 of the FPC 4 to be mounted to the mounting portion 3 of the other surface of the panel 1, at least the other end of the FPC 4 or its surrounding portion is suctioned and held in a direction perpendicular to the longitudinal direction of the other end of the FPC 4 by the suction holes 47 formed in the bars 42 of the bending jig 41.

Figure 9:
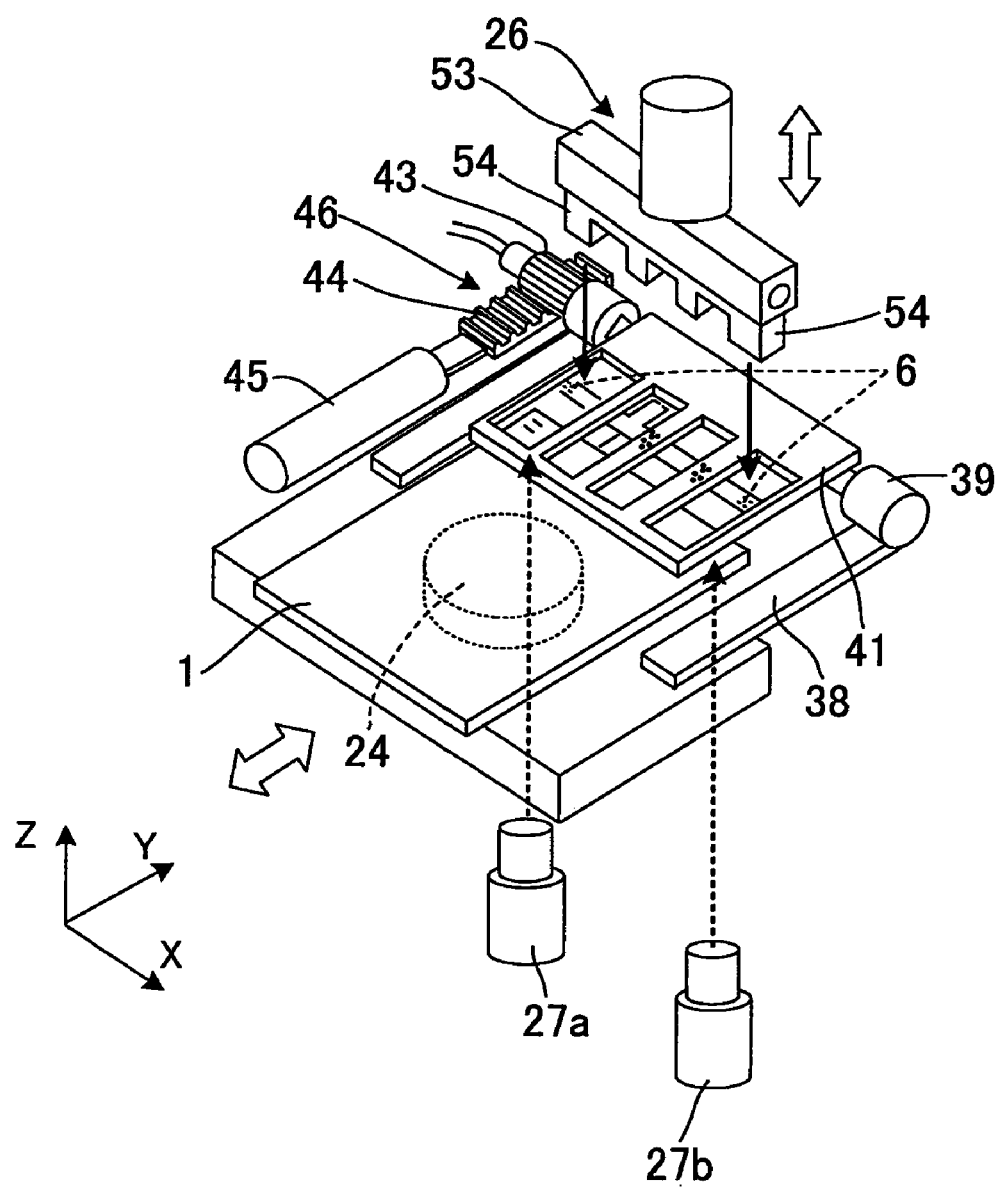
[FIG. 9] A perspective view showing a temporarily pressing operation of the bending-temporarily pressing device of the exemplary embodiment.

Next, the bending jig 41 is rotated in a direction indicated by an arrow e by driving the opening-closing drive unit 46, and thus the other end side of the FPC 4 is bent, as shown in FIG. 9. In this state, before the FPC recognition mark 35 is recognized, the stage 24 is moved to recognize the position of the panel recognition mark 34 on the mounting portion 3 of the panel 1, so that the mounting portion 3 of the other surface of the panel 1 is positioned on the recognition cameras 27a and 27b. Accordingly, the one end electrode 5 of the FPC 4 is touch panel to the mounting portion 2 of the one surface, and is then turned upside down to place on the stage 24. By firstly recognizing the position of the panel 1 of which the other end side of the FPC 4 is bent, it is possible to accurately correct the position of the other end of the FPC 4 including the other end electrode 6 of the FPC 4 having the FPC recognition mark 35 with respect to the position which is suctioned and held by the press head 26. Then, the stage 24 is moved so as to position the other end electrode 6 of the FPC 4 immediately under the suction-pressing projections 54 that protrude from the press tool 53 of the press head 26. The press tool 53 is lowered to suction and hold the other end of the FPC 4 including the other electrode 6 or its surrounding portion and simultaneously release the suction of the suction holes 47 of the bending jig 41, and the FPC recognition mark 35 is recognized by the recognition cameras 27a and 27b. Then, the stage 24 is moved so as to align the position of the panel recognition mark 34 and the position of the FPC recognition mark 35, and thus the position of the mounting portion 3 of the other surface of the panel 1 and the position of the other end electrode 6 of the FPC 4 are matched to each other with high accuracy. Subsequently, the other end electrode 6 of the FPC 4 is pressed on the mounting portion 3 of the other surface of the panel 1 by suction-pressing projections 54 of the press tool 53, with the ACF 7 being interposed therebetween, thereby temporarily pressing the other end electrode 6 of the FPC 4 and the mounting portion 3 of the other surface.

Figure 10:
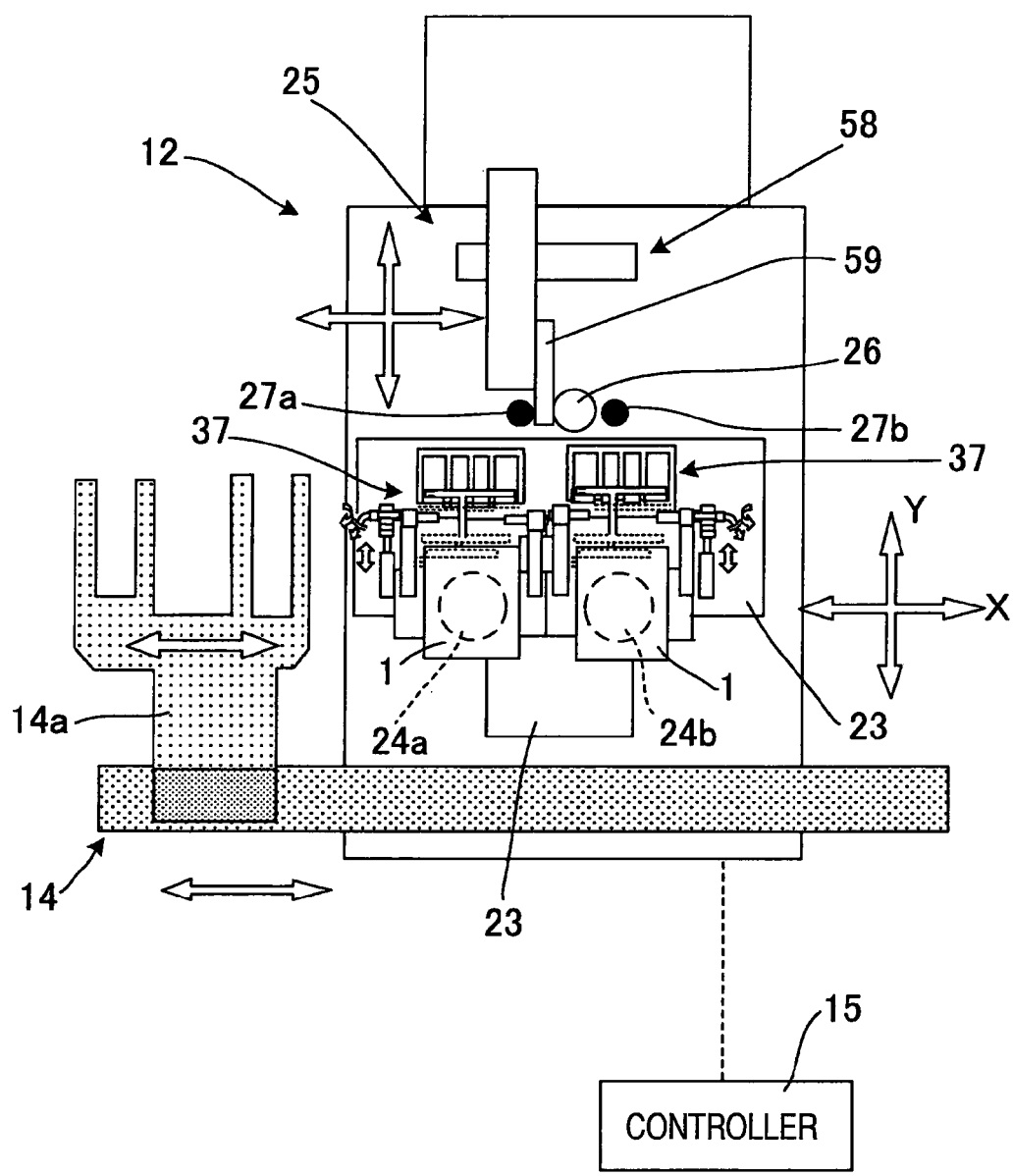
[FIG. 10] A plan view showing another configuration of the bending-temporarily pressing device of the exemplary embodiment.

In this case, an example is shown in the above-described bending-temporary pressing device 12, in which the temporary pressing unit 25 is disposed at the support arm 52 of a rotor 51 so as to move the press head 26 in a vertical direction and adjust the position of the press head 26 around the vertical shaft. However, as shown in FIG. 10, the press head (Z, θ-axis) 26 may be mounted on the movable head 59 of a robot device (X, Y-axis) 58.

Figure 11:
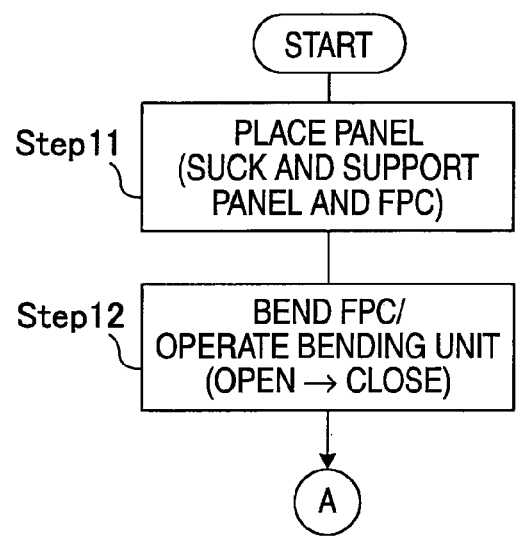
[FIG. 11] A process flow from panel installation to FPC bending.
Figure 12:
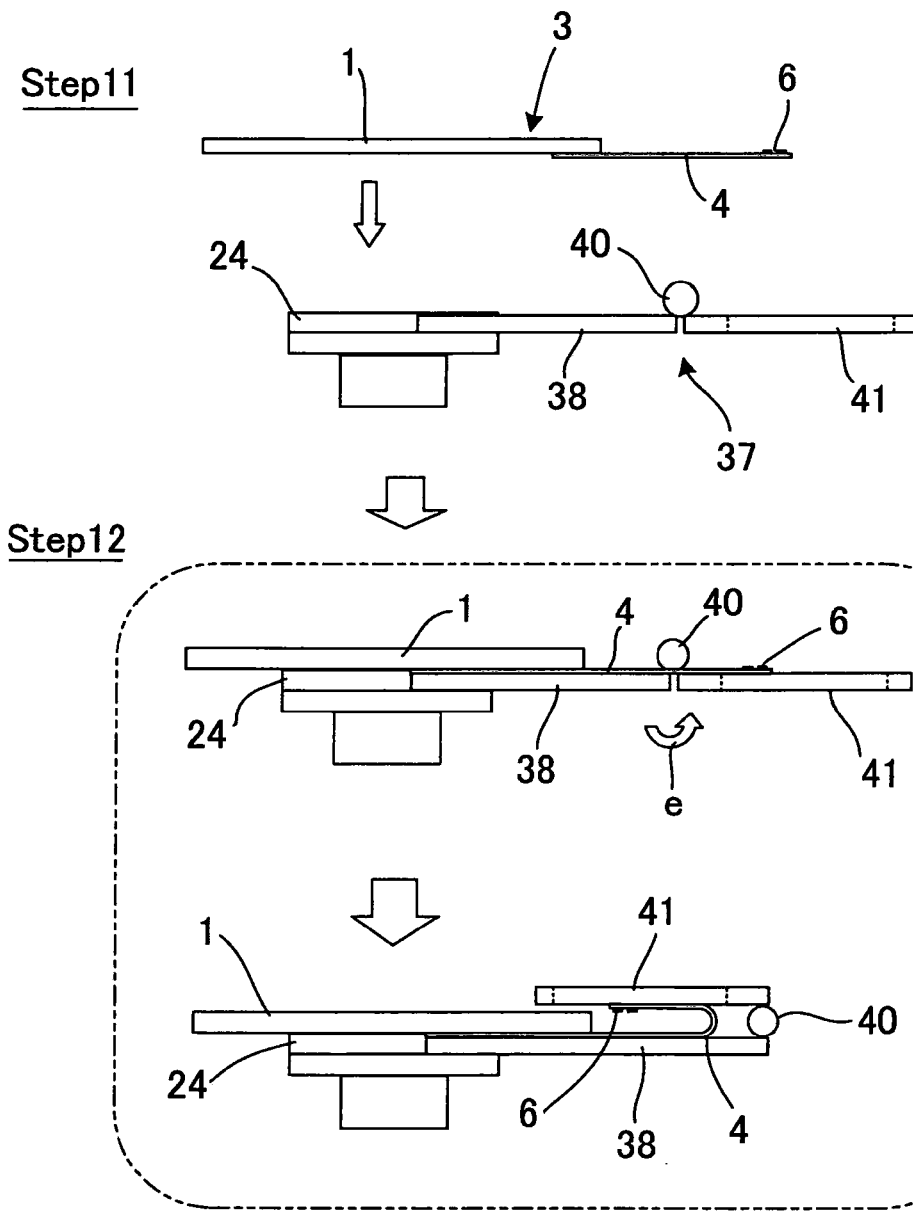
[FIG. 12] Explanations of each step shown in the process flow of FIG. 11.

The bending and pressing operation will now be described in detail with reference to a flowchart and an operation explaining view shown in FIGS. 11 to 16. If the operation starts, as shown in the flowchart of FIG. 11 and the operation explaining view of FIG. 12, at step 11, the panel 1 is placed on the stage 24, and is suctioned and supported. Except for the disposition portion of the other end electrode 6 of the FPC 4 to be mounted on the mounting portion 3 of the other surface of the panel 1, at least the other end of the FPC 4 or its surrounding portion is suctioned and held by the suction holes 47 of the bending jig 41. Next, at step 12, the opening-closing drive unit 46 is operated to rotate the bending jig 41 from the open position to the closed position, and the other end side of the FPC 4 is bent in such a way that the position of the mounting portion 3 of the other surface of the panel 1 and the position of the other end electrode 6 of the FPC 4 are deviated from each other in a plan view.

Figure 13:
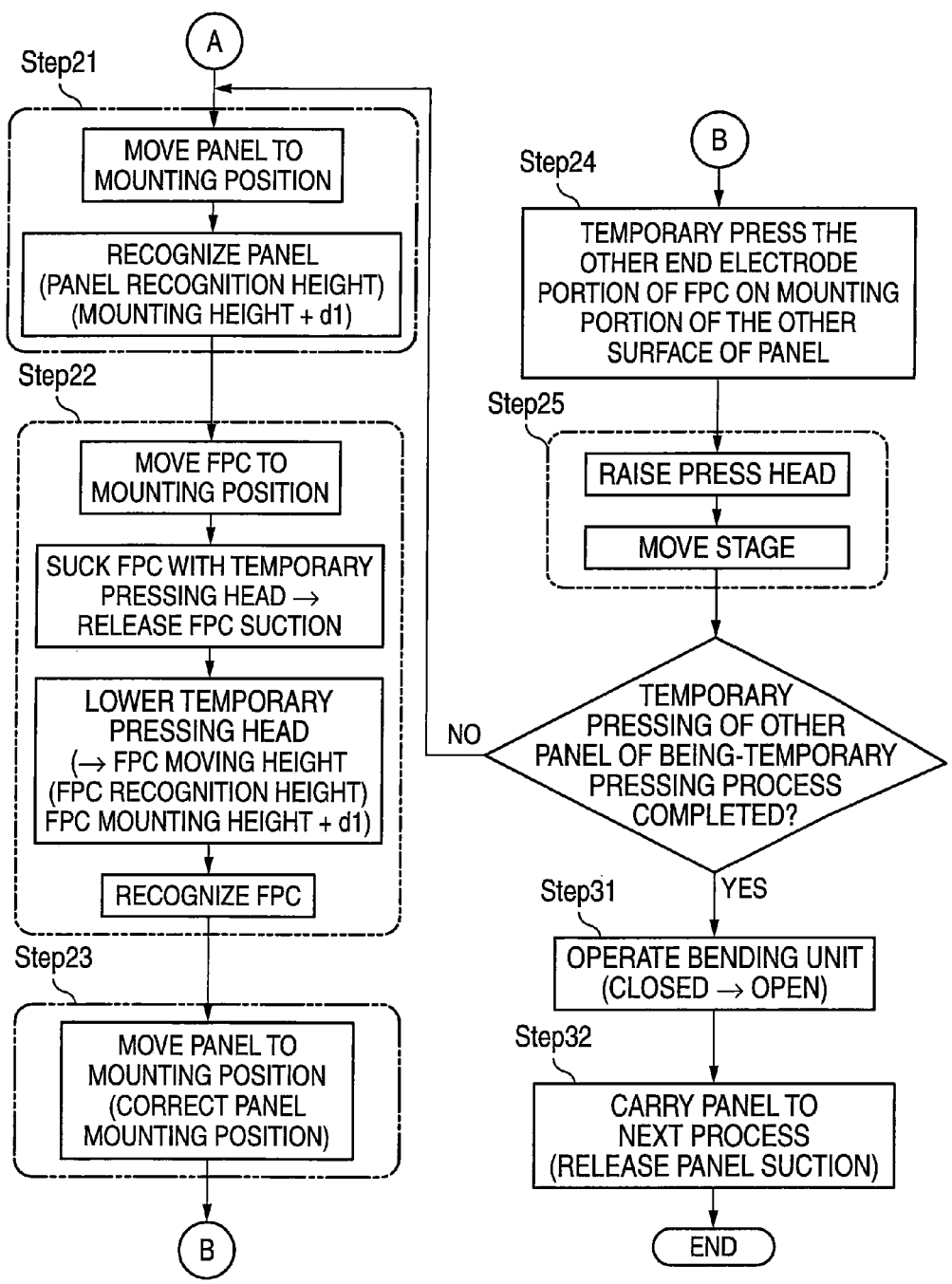
[FIG. 13] A process flow from FPC bending to panel ejection.

Then, as shown in the flowchart of FIG. 13 and the operation explaining view of FIG. 14, at step 21, the stage 24 is moved in a direction along the surface of the panel 1, as indicated by an arrow f, to position the mounting portion 3 of the other surface of the panel 1 on the mounting position immediately over the recognition cameras 27a and 27b. In this case, the height of the stage 24 is set in such a way that the mounting portion 3 of the other surface of the panel 1 is a panel recognition height position of (mounting height position+d1), and the position of the panel recognition mark 34 is accurately recognized by the recognition cameras 27a and 27b. The d1 is set so as to prevent interference with the lower base stage 56 when the panel 1 is moved in a direction along the surface of the panel 1, and, for example, is set as approximately 2 mm. Additionally, at step 22, the stage 24 is moved in a direction along the surface of the panel 1, as indicated by an arrow g, to position the other end electrode 6 of the FPC 4 at a mounting position immediately over the recognition cameras 27a and 27b. The press head 26 is lowered in a thickness direction of the panel 1, as indicated by an arrow h, to suction and hold the other end of the FPC 4 including the rear surface of the other end electrode 6 thereof or its surrounding portion. After releasing the suction by the suction holes 47 of the bending jig 41, the press head 26 is further lowered in a thickness direction of the panel 1, as indicated by an arrow i, to position the other end electrode 6 of the FPC 4 at an FPC recognition height position of (mounting height position+ d1). The position of the FPC recognition mark 35 is accurately recognized by the recognition cameras 27a and 27b. In this case, if it is a height position within a focus depth of the recognition cameras 27a and 27b, the FPC recognition height position may be set as a mounting height position.

Next, at step 23, in the case in which the FPC recognition height position is set as the mounting height position, after the press head 26 is raised to a position which does not interfere with the panel 1, for example, (mounting height position+d1), the stage 24 is moved in a direction along the surface of the panel 1, as indicated by an arrow j, to position the mounting portion 3 of the other surface of the panel 1 at the mounting position. In this case, the moving position of the stage 24, on which the panel 1 is placed, is controlled with high accuracy according to the recognition results of the recognition cameras 27a and 27b. The position of the mounting portion 3 of the other surface of the panel 1 and the position of the other end electrode 6 of the FPC 4, in which the other end of the FPC 4 including the rear surface of the other end electrode 6 thereof or its surrounding portion is suctioned and held by the press head 26, are matched to each other by position alignment. In this case, in the case in which the press head 26 has a configuration whose position is adjustable, the position alignment can be performed by relatively adjusting the position of both or any one of the stage 24 and the press head 26.

Next, as shown in the flowchart of FIG. 13 and the operation explaining view of FIG. 15, at step 24 of bending and temporary pressing operation, the press head 26 is lowered in a thickness direction of the panel 1, as indicated by an arrow k. The other end electrode 6 of the FPC 4 is pressed on the mounting portion 3 of the other surface of the panel 1 by the suction-pressing projections 54 of the press tool 53, with the ACF 7 being interposed therebetween, and then the temporary pressing is performed by applying predetermined temperature and pressure to the other end electrode 6 and the mounting portion 3. After that, at step 25, the press head 26 is raised to a standby original position, as indicated by an arrow l, and the stage 24 is moved to the original position, as indicated by an arrow m, in which the panel 1 is carried in or out. Next, it is determined whether or not the bending-temporary pressing process is performed for other panel 1, and in the case in which there is a panel 1 which is not subjected to the bending and temporary pressing process, the panel 1 is returned to the stage 21, and then the above process is repeated. In the case in which the bending and temporary pressing process is completed, the panel is transferred to next step 31.

Next, as shown in FIGS. 1 and 6, the flowchart of FIG. 13 and the operation explaining view of FIG. 16, at step 31, the bending unit 37 is operated to rotate the bending jig 41 toward the open position, as indicated by an arrow n. At step 32, after the suction of the panel 1 on the stage 24 is released, the panel is delivered to the support arm 14a of the panel transfer unit 14, as indicated by an arrow o, and then the panel 1 is transferred to the next process, i.e., the permanent pressing device 13.

Now, a first preferred example of a temporary pressing process will be described in detail with reference to FIG. 17.

Figure 17A:
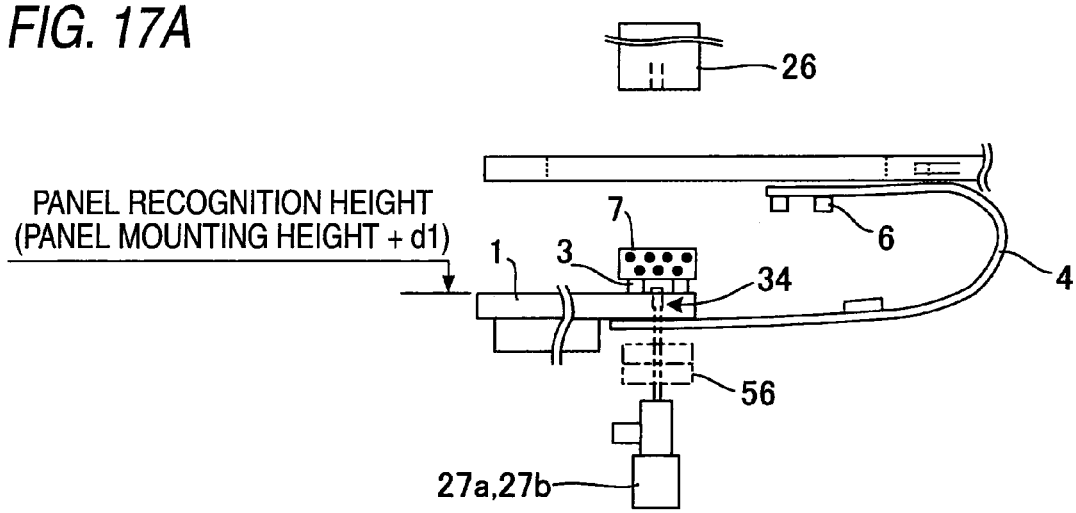
[FIGS. 17A-17C] Explanatory views of a first example of the provisional pressing process.
Figure 17B:
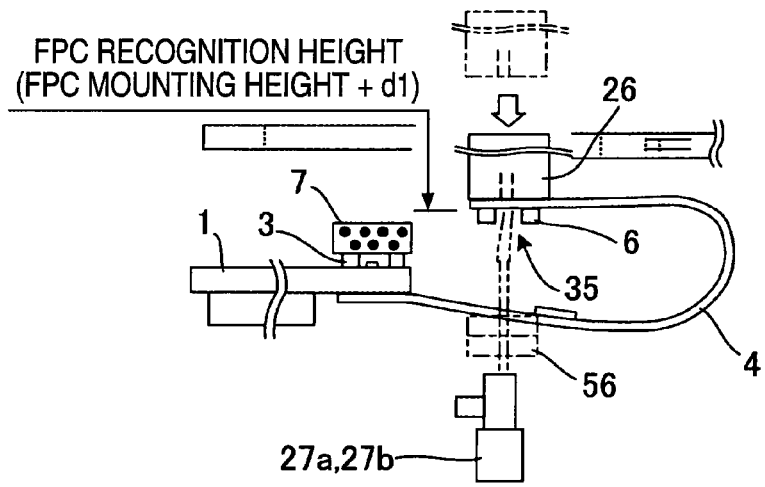
Figure 17C:
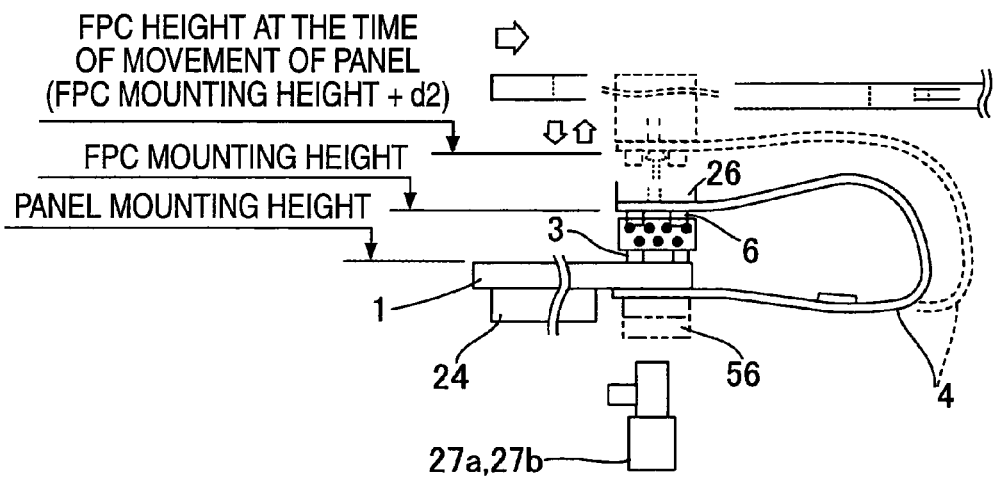

In the first preferred example, at the time of recognition of the panel recognition mark 34 displaying the reference position of the mounting portion 3 of the other surface of the panel 1, as shown in FIG. 17(a), the stage 24 is moved and positioned so that the panel recognition mark 34 is positioned immediately over the recognition cameras 27a and 27b or at the height position of the panel recognition (mounting height position+d1), and the position of the panel recognition mark 34 is recognized by the recognition cameras 27a and 27b. At the time of recognition of the FPC recognition mark 35 displaying the reference position of the other end electrode 6 of the FPC 4, as shown in FIG. 17(b), the stage 24 is moved and positioned so that the FPC recognition mark 35 is positioned immediately over the recognition cameras 27a and 27b. The press head 26 is lowered in the state in which the other end of the FPC 4 including the rear surface of the other end electrode 6 or its surrounding portion is suctioned and held by the press head 26. The FPC recognition mark 35 of the FPC 4 is recognized by the recognition cameras 27a and 27b at the height position of the FPC recognition (mounting height position+d1). After that, when the panel 1 is moved to the mounting position, as shown in FIG. 17(c), the press unit 26 is raised a little from the height position of the FPC recognition (mounting height position+d1), and is positioned at the height position at the time of movement of the other end of the FPC 4 (mounting height+d2). d2 is set as 3 mm, for example, if d1 is set as 2 mm. After that, the position of the mounting portion 3 of the other surface of the panel 1 and the position of the other end electrode 6 of the FPC 4, in which the other end of the FPC 4 including the rear surface of the other end electrode 6 thereof or its surrounding portion is suctioned and held by the press head 26, are matched to each other by position alignment. At the time of temporary pressing, the stage 24 is lowered so as to position the panel 1 at the mounting height. After the rear surface of the mounting portion 3 of the other surface of the panel 1 abuts against the lower base member 56 to support the lower base member, in order to position the other end electrode 6 of the FPC 4 at the mounting height position, the press head 26 suctioning and holding the other end of the FPC 4 is lowered in the thickness direction of the panel 1 to apply the pressure and thus perform the temporary pressing.

Figure 18A:
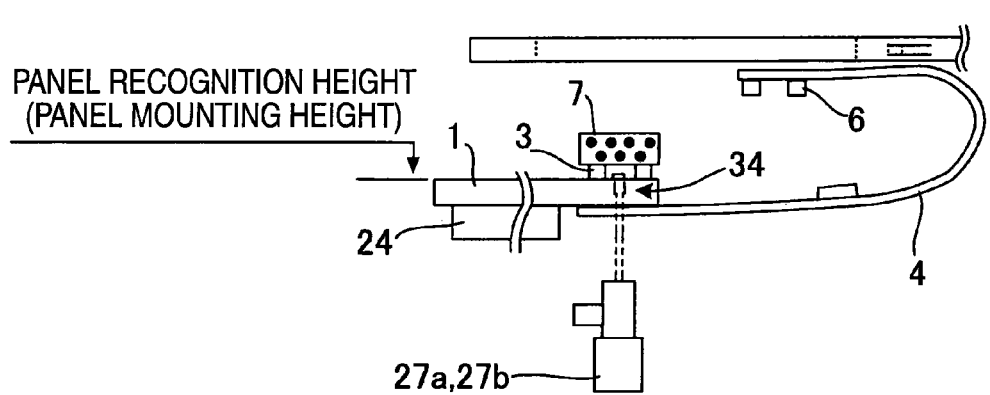
[FIGS. 18A-18C] Explanatory views of a second example of the provisional pressing process.
Figure 18B:
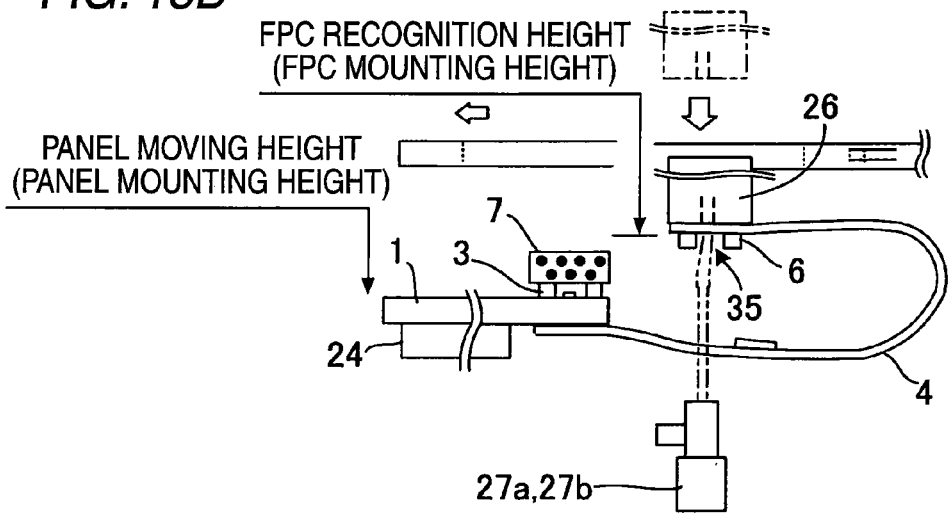
Figure 18C:
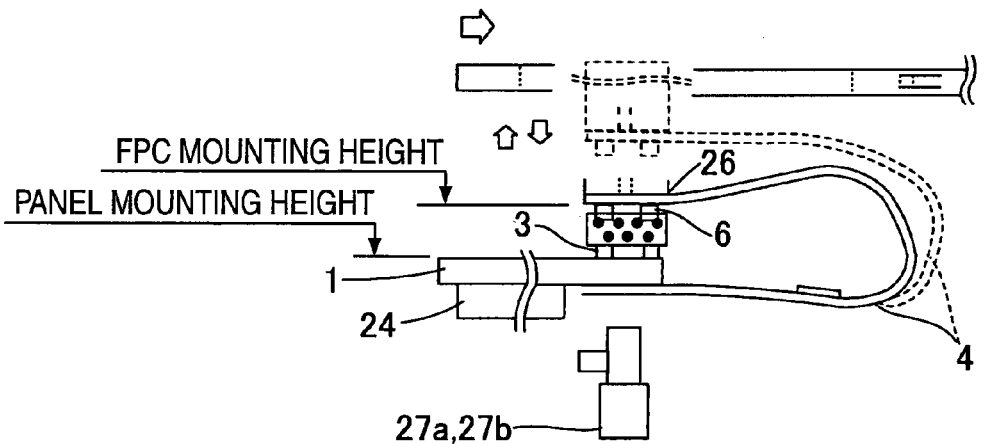
Figure 19A:
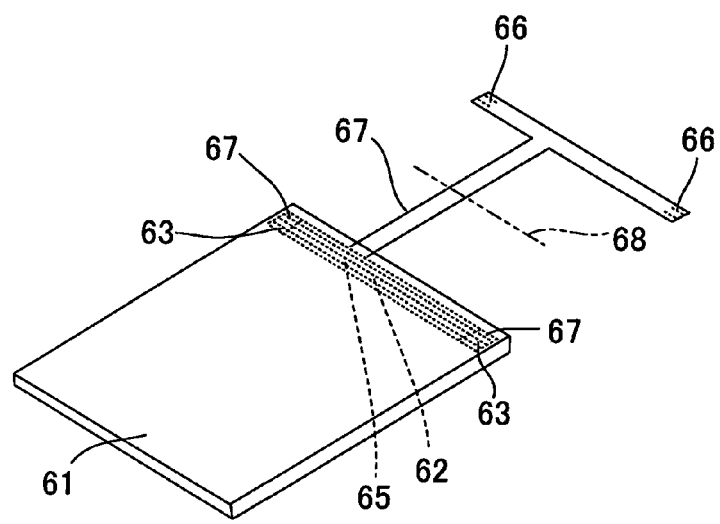
[FIGS. 19A-19B] Perspective views showing a part mounting process of a related art.
Figure 19B:
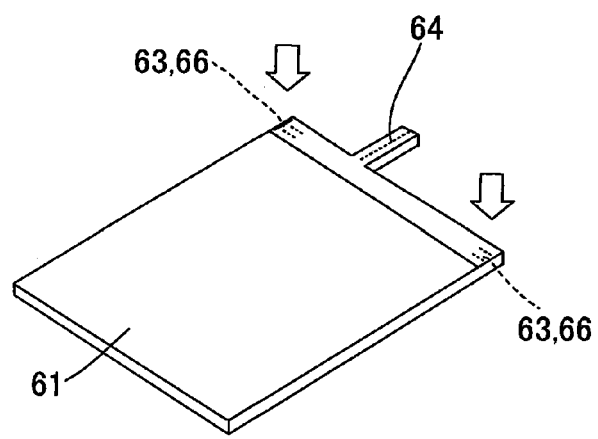

Now, a second preferred example of a further detailed process in the temporary pressing process will be described in detail with reference to FIG. 18. In this preferred example, at the time of recognition of the panel recognition mark 34 displaying the reference position of the mounting portion 3 of the other surface of the panel 1, as shown in FIG. 18(a), the stage 24 is moved and positioned so that the panel recognition mark 34 is positioned immediately over the recognition cameras 27a and 27b and at the mounting height position, and the panel recognition mark 34 is recognized by the recognition cameras 27a and 27b. At the time of recognition of the FPC recognition mark 35 displaying the reference position of the other end electrode 6 of the FPC 4, as shown in FIG. 18(b), the stage 24 is moved and positioned in a direction along the surface of the panel 1, in the state in which the panel 1 is positioned at the mounting height, so that the FPC recognition mark 35 is positioned immediately over the recognition cameras 27a and 27b. Next, the other end of the FPC 4 including the rear surface of the other end electrode 6 of the FPC 4 or its surrounding portion is suctioned and held by the press head 26, and the press head 26 is lowered to position the FPC recognition mark 35 of the FPC 4 at the mounting height position. The FPC recognition mark 35 of the FPC 4 is recognized by the recognition cameras 27a and 27b. After that, at the time of temporary pressing, as shown in FIG. 18(c), after the press head 26 is raised to position the other end of the FPC 4 at a proper retreat position, the stage 24 is moved in a direction along the surface of the panel 1, in the state in which the panel 1 is positioned at the mounting height, to position the mounting portion 3 of the other surface at the mounting position. The position of the mounting portion 3 of the other surface of the panel 1 and the position of the other end electrode 6 of the FPC 4, in which the other end of the FPC 4 including the rear surface of the other end electrode 6 thereof or its surrounding portion is suctioned and held by the press head 26, are matched to each other by position alignment. Next, in order to position the other end electrode 6 of the FPC 4 at the mounting height, the press head 26 suctioning and holding the other end of the FPC 4 is lowered to apply the pressure and thus perform the temporary pressing. In this preferred example, in the case in which the rear surface of the mounting portion 3 of the other surface of the panel 1 is supported by the lower base member 56 (not shown), it may be constituted in such a way that the lower base member 56 is lowered to the retreat position at the time of movement of the panel 1, and is raised to the support position at the time of temporary pressing. Also, although the case in which the rear surface of the mounting portion 3 of the other surface of the panel 1 is supported by the lower base member 56 (not shown) is described herein, if the relative pressed stress when the mounting portion 3 of the other surface of the panel 1 is temporarily pressed is low, and the mounting accuracy and the quality are not adversely affected, the rear surface of the mounting portion 3 of the other surface of the panel 1 need not be supported by the lower base member 56 (not shown) at the time of temporary pressing.

Although the invention is described with reference to concrete and specific embodiments, it is apparent to those skilled in the art that the invention may be variously modified or altered without departing from the spirit or scope of the invention.

The present application claims priority from Japanese Patent Application No. 2008-191589, filed on Jul. 25, 2008, the contents of which are hereby incorporated by reference into this application.

INDUSTRIAL APPLICABILITY

The part mounting device and the part mounting method according to the invention can mount the other end of the flexible board to the mounting portion of the other surface of the panel with high accuracy, and can fabricate a part with high reliability, in which both end electrodes of the flexible board are mounted to the mounting portion of both surfaces of the panel. As a result, the invention can be properly applied to a touch panel, in which both end electrodes of the flexible board are mounted to the mounting portion of both front and rear surfaces of the panel, or various board structures.

REFERENCE SIGNS LIST

1. Panel
2. Mounting portion of one surface
3. Mounting portion of the other surface
4. FPC (Flexible Printed Circuit board)
5. One end electrode
6. The other end electrode
10. Part mounting device
12. bending-temporary pressing device
24. (24a, 24b) Stage
26. Press head
27a, 27b Recognition camera
34. Panel recognition mark
35. FPC recognition mark
37. Bending unit
41. Bending jig
46. Opening-Closing drive unit
47. Suction hole
53. Press tool
54. Suction-pressing projection (Suction Unit)
55. Suction projection (Suction Unit)

The invention claimed is:

1. A part mounting device which bends a flexible board whose one end electrode is mounted on a mounting portion of one surface of a panel, so as to mount the other end electrode of the flexible board on a mounting portion of the other surface of the panel, comprising:
   a stage which moves and positions the panel while supporting the panel with the other surface facing upward;
   a bending unit holding and bending the other end side of the flexible board;
   a recognition camera disposed at the one surface side of the panel supported by the stage, and recognizing a position of the mounting portion of the other surface of the panel and a position of the other end electrode of the flexible board;
   a press head mounting the other end electrode of the flexible board on the mounting portion of the other surface of the panel while holding the other end electrode and temporarily pressing the other end electrode of the flexible board to the mounting portion of the other surface of the panel;
   a controller which motion-controls the stage, the bending unit, the recognition camera, and the press head so as to bend the other end side of the flexible board in a state where a position in plan view of the mounting portion of the other surface of the panel and a position in plan view of the other end electrode of the flexible board are shifted relative to each other, recognize the position of the mounting portion of the other surface of the panel, hold the other end electrode of the flexible board with the press head, recognize the position of the other end electrode of the flexible board, match the position of the mounting portion of the other surface of the panel and the position of the other end electrode of the flexible board, and mount the other end electrode of the flexible board to the mounting portion of the other surface of the panel by temporarily pressing the other end electrode of the flexible board to the mounting portion of the other surface of the panel with the press head.

2. The part mounting device according to claim 1, wherein the bending unit includes a suction holder which suctions and holds at least the other end of the flexible board except for a disposition portion of the other end electrode of the flexible board or the vicinity thereof in a direction perpendicular to a longitudinal direction of the flexible board.

3. The part mounting device according to claim 1, wherein the press head includes a suction holder which suctions and holds the other end of the flexible board including the other end electrode of the flexible board, or the vicinity thereof.

4. The part mounting device according to claim 1, wherein the controller controls the stage and the press head so that a height of the mounting portion of the other surface of the panel and a height of the other electrode of the flexible board are respectively set at a mounting height or at a height higher or lower than the mounting height by a predetermined distance when the controller recognizes the position of the mounting portion of the other surface of the panel and the position of the other end electrode of the flexible board.

5. A part mounting method for bending a flexible board whose one end electrode is mounted on a mounting portion of one surface of a panel so as to mount the other end electrode of the flexible board on a mounting portion of the other surface of the panel, comprising:
- a panel supporting process supporting the panel on a stage with the other surface of the panel facing upward;
- a bending process holding and bending the other end side of the flexible board in a state where a position in plan view of the mounting portion of the other surface of the panel and a position in plan view of the other end electrode are shifted relative to each other;
- a mounting portion recognizing process recognizing a position of the mounting part of the other surface of the panel with a recognition camera disposed at the one surface side of the panel;
- a holding process holding the other end electrode of the flexible board with a press head;
- a the other end electrode recognizing process recognizing a position of the other end electrode of the flexible board with the recognition camera disposed at the one surface side of the panel;
- a position matching process matching the position of the mounting portion of the other surface of the panel and the position of the other end electrode of the flexible board;
- a mounting process mounting the other end electrode of the flexible board to the mounting portion of the other surface of the panel by temporarily pressing the other end electrode of the flexible board to the mounting portion of the other surface of the panel with the press head.

6. The part mounting method according to claim 5, wherein during the mounting portion recognition process and the other end electrode recognition process, recognizing comprises recognizing the mounting portion of the other surface of the panel and the other end electrode of the flexible board while the mounting portion of the other surface of the panel and the other end electrode of the flexible board are positioned at a mounting height or at a height higher or lower than the mounting height in a predetermined distance respectively.

* * * * *

UNITED STATES PATENT AND TRADEMARK OFFICE
CERTIFICATE OF CORRECTION

PATENT NO. : 8,074,351 B2  
APPLICATION NO. : 12/665830  
DATED : December 13, 2011  
INVENTOR(S) : Ryuji Hamada et al.

Page 1 of 1

It is certified that error appears in the above-identified patent and that said Letters Patent is hereby corrected as shown below:

In column 7, line 48, insert --.-- after thereof

Signed and Sealed this  
Twenty-ninth Day of May, 2012

David J. Kappos  
*Director of the United States Patent and Trademark Office*